US009508300B2

(12) United States Patent
Choi et al.

(10) Patent No.: US 9,508,300 B2
(45) Date of Patent: Nov. 29, 2016

(54) DRIVING CIRCUIT HAVING EXTRA TRANSISTOR OR CAPACITOR, AND FLAT PANEL DISPLAY DEVICE INCLUDING THE DRIVING CIRCUIT

(71) Applicant: SAMSUNG DISPLAY CO., LTD., Yongin-si, Gyeonggi-do (KR)

(72) Inventors: Jung-Mi Choi, Yongin-si (KR); Bo-Yong Chung, Yongin-si (KR); Keum-Nam Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 417 days.

(21) Appl. No.: 13/714,317

(22) Filed: Dec. 13, 2012

(65) Prior Publication Data
US 2014/0002423 A1 Jan. 2, 2014

(30) Foreign Application Priority Data

Jun. 29, 2012 (KR) .......................... 10-2012-0070849

(51) Int. Cl.
*G09G 3/36* (2006.01)
*H01L 27/12* (2006.01)
(Continued)

(52) U.S. Cl.
CPC .......... *G09G 3/3688* (2013.01); *G09G 3/3677* (2013.01); *H01L 21/823475* (2013.01);
(Continued)

(58) Field of Classification Search
CPC .. G09G 3/006; G09G 3/3266; G09G 3/3275; G09G 3/3677; G09G 3/3688; G09G 2310/0286; G09G 2330/08; H01L 21/823475; H01L 23/5223; H01L 23/525; H01L 23/5254; H01L 23/5258; H01L 23/5283; H01L 27/0629; H01L 27/1255; H01L 28/60; H01L 2924/00; H01L 2924/0002; G11C 19/18; G11C 19/182; G11C 19/184; G11C 19/28; G11C 19/285

See application file for complete search history.

(56) References Cited

U.S. PATENT DOCUMENTS 5,111,060 A * 5/1992 Asada ........................... 327/526
5,235,272 A * 8/1993 Henley .................... 324/760.01
(Continued)

FOREIGN PATENT DOCUMENTS

| JP | 2010-262816 A | 11/2010 |
|---|---|---|
| KR | 10-0635495 | 10/2006 |
| KR | 10-2008-0024009 | 3/2008 |
| KR | 10-2008-0051367 | 6/2008 |

OTHER PUBLICATIONS

Korean Patent Abstracts Publication No. 1020060092666 A, dated Aug. 23, 2006, for corresponding Korean Patent KR 10-0635495 listed above.

*Primary Examiner* — Keith Crawley
(74) *Attorney, Agent, or Firm* — Lewis Roca Rothgerber Christie LLP

(57) ABSTRACT

A driving circuit includes: an input terminal; an output terminal; a first transistor having a source electrode coupled to the input terminal, a drain electrode coupled to the output terminal, and a gate electrode; a second transistor having a source electrode, a drain electrode, and a gate electrode respectively coupled to the source electrode, the drain electrode, and the gate electrode of the first transistor; a first capacitor having a first electrode coupled to the input terminal and a second electrode coupled to the output terminal; and a second capacitor coupled in parallel with the first capacitor and having a first electrode coupled to the first electrode of the first capacitor and a second electrode that is floated.

14 Claims, 3 Drawing Sheets

(51) Int. Cl.
*H01L 23/522* (2006.01)
*H01L 49/02* (2006.01)
*H01L 21/8234* (2006.01)
*H01L 27/06* (2006.01)
*G11C 19/18* (2006.01)
*G09G 3/32* (2016.01)

(52) U.S. Cl.
CPC ....... *H01L23/5223* (2013.01); *H01L 27/0629* (2013.01); *H01L 27/1255* (2013.01); *H01L 28/60* (2013.01); *G09G 3/3266* (2013.01); *G09G 2300/08* (2013.01); *G09G 2310/0286* (2013.01); *G11C 19/182* (2013.01); *H01L 2924/0002* (2013.01)

(56) References Cited

U.S. PATENT DOCUMENTS

| | | | |
|---|---|---|---|
| 5,260,818 A * | 11/1993 | Wu | 349/55 |
| 5,392,143 A * | 2/1995 | Akiyama et al. | 349/55 |
| 6,345,085 B1 * | 2/2002 | Yeo et al. | 377/54 |
| 7,764,330 B2 * | 7/2010 | Kawamura et al. | 349/55 |
| 2004/0207590 A1 * | 10/2004 | Lu et al. | 345/93 |
| 2007/0152567 A1 * | 7/2007 | Yao | G09G 3/3233 |
| | | | 313/504 |
| 2008/0012816 A1 * | 1/2008 | Moon | 345/100 |
| 2011/0012880 A1 * | 1/2011 | Tanaka et al. | 345/211 |
| 2011/0234565 A1 * | 9/2011 | Morii et al. | 345/211 |
| 2012/0121061 A1 * | 5/2012 | Sakamoto | G11C 19/28 |
| | | | 377/64 |
| 2012/0326176 A1 * | 12/2012 | Shirouzu | H01L 27/3265 |
| | | | 257/88 |

* cited by examiner

DRIVING CIRCUIT HAVING EXTRA TRANSISTOR OR CAPACITOR, AND FLAT PANEL DISPLAY DEVICE INCLUDING THE DRIVING CIRCUIT

CROSS-REFERENCE TO RELATED APPLICATION

This application claims priority to and the benefit of Korean Patent Application No. 10-2012-0070849, filed on Jun. 29, 2012 in the Korean Intellectual Property Office, the entire content of which is incorporated herein by reference.

BACKGROUND

1. Field

Aspects of embodiments of the present invention relate to a driving circuit, a flat panel display device having the driving circuit, and a method of repairing the driving circuit.

2. Description of the Related Art

Generally, a flat panel display device, such as a liquid crystal display (LCD) or an organic light emitting display device is manufactured by a semiconductor process. In the semiconductor process, lines configuring transistors, capacitors, and circuits are formed in patterns having a fine line width and a fine interval therebetween, and the pattern is disposed in a multilayered structure including an interlayer insulating layer therebetween. Since the patterns are disposed with a fine interval therebetween and the interlayer insulating layer is very thin, the transistors and capacitors are easily damaged due to static electricity generated in the manufacturing process. For example, a gate electrode, a source electrode, and a drain electrode of a transistor may be short-circuited to one another, or two electrodes of a capacitor may be short-circuited to each other.

A defect due to the above-mentioned short-circuiting may be detected in a test step that is the final step of the manufacturing process, and the defect may be removed through a repair process. Since the display device normally operates after removing the defect through the repair process, device manufacturing costs of the device may be reduced.

Lines configuring the circuit are prepared against damage by forming a repair line. However, since elements such as transistors or capacitors are not easily repaired, some circuits or elements may not operate normally. In order to reduce or prevent damage due to the static electricity, a protection circuit may be added or a design of the driving circuit may be changed. However, it may be difficult to prevent the damage generated in an unspecified position. Therefore, a technology capable of easily repairing the element suffering damage from static electricity may be useful.

SUMMARY

Embodiments of the present invention provide for a driving circuit capable of being easily repaired, a flat panel display device having the driving circuit, and a method of repairing the driving circuit.

In an exemplary embodiment of the present invention, a driving circuit is provided. The driving circuit includes: an input terminal; an output terminal; a first transistor including a source electrode coupled to the input terminal, a drain electrode coupled to the output terminal, and a gate electrode; a first capacitor including a first electrode coupled to the input terminal and a second electrode coupled to the output terminal; and a second capacitor coupled in parallel with the first capacitor and including a first electrode coupled to the first electrode of the first capacitor, and a second electrode that is floated.

The second electrodes of the first and second capacitors may include metal.

The second electrode of the first capacitor and the output terminal may be coupled to each other by melting the metal.

The first electrode and the second electrode of the second capacitor may be short-circuited to each other.

A floated ending portion of the second electrode of the second capacitor may have an irregular cross section.

The driving circuit may further include a second transistor including a source electrode, a drain electrode, and a gate electrode respectively coupled to the source electrode, the drain electrode, and the gate electrode of the first transistor.

An electrode of the second transistor may be electrically separated so that the second transistor is configured to not affect operation of the driving circuit.

According to another exemplary embodiment of the present invention, a flat panel display device is provided. The flat panel display device includes: a plurality of pixels coupled to a plurality of scan lines and a plurality of data lines arranged in a matrix; a scan driving circuit including a driving circuit that includes an input terminal and an output terminal, the driving circuit being configured to receive a first control signal through the input terminal and provide a scan signal to one of the scan lines through the output terminal; and a data driving circuit including a driving circuit that includes an input terminal and an output terminal, the driving circuit of the data driving circuit being configured to receive a second control signal and data through the input terminal and provide a data signal to one of the data lines through the output terminal. The driving circuit of the scan driving circuit or the data driving circuit further includes: a first transistor including a source electrode coupled to the input terminal, a drain electrode coupled to the output terminal, and a gate electrode; a first capacitor including a first electrode coupled to the input terminal and a second electrode coupled to the output terminal; and a second capacitor coupled in parallel with the first capacitor and including a first electrode coupled to the first electrode of the first capacitor, and a second electrode that is floated.

The second electrodes of the first and second capacitors may include metal.

The second electrode of the first capacitor and the output terminal may be coupled to each other by melting the metal.

The first electrode and the second electrode of the second capacitor may be short-circuited to each other.

A floated ending portion of the second electrode of the second capacitor may have an irregular cross section.

The driving circuit may further include second transistor including a source electrode, a drain electrode, and a gate electrode respectively coupled to the source electrode, the drain electrode, and the gate electrode of the first transistor.

An electrode of the second transistor may be electrically separated so that the second transistor is configured to not affect operation of the driving circuit.

According to yet another exemplary embodiment of the present invention, a method is provided. The method includes forming a driving circuit on a substrate. The driving circuit includes: an input terminal; an output terminal; a first transistor including a source electrode coupled to the input terminal, a drain electrode coupled to the output terminal, and a gate electrode; a first capacitor including a first electrode coupled to the input terminal and a second electrode coupled to the output terminal; and a second capacitor coupled in parallel with the first capacitor and including a first electrode coupled to the first electrode of the first capacitor, and a second electrode that is floated. The method further includes electrically separating the second electrode of the first capacitor from the output terminal and coupling the second electrode of the second capacitor to the output terminal.

The method may further include electrically separating an electrode of the first transistor so that the first transistor is configured to not affect operation of the driving circuit.

BRIEF DESCRIPTION OF THE DRAWINGS

The accompanying drawings, together with the specification, illustrate exemplary embodiments of the present invention, and, together with the description, serve to explain aspects and principles of the present invention.

DETAILED DESCRIPTION

Figure 1:
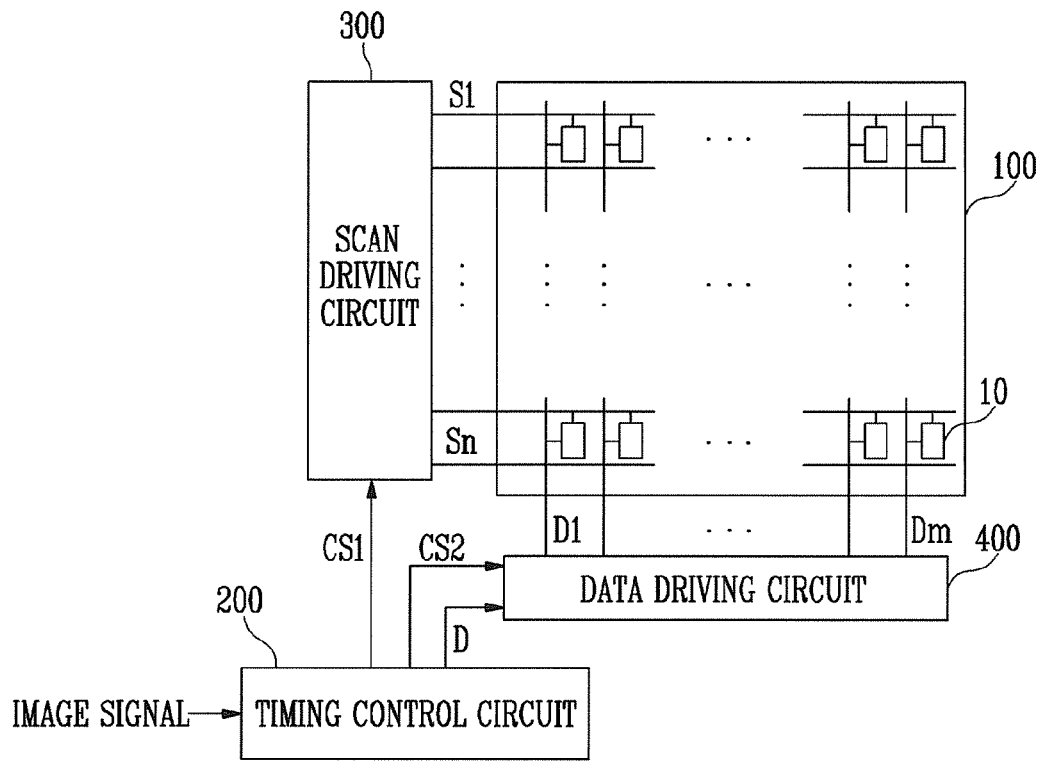
FIG. 1 is a block diagram showing a flat panel display device according to an exemplary embodiment of the present invention.

Hereinafter, certain exemplary embodiments according to the present invention will be described with reference to the accompanying drawings. Here, when a first element is described as being coupled to a second element, the first element may be directly coupled (e.g., connected) to the second element or indirectly coupled (e.g., electrically connected) to the second element via one or more third elements. Further, some of the elements that are not essential to one of ordinary skill in the art to sufficiently understand an embodiment of the invention may be omitted for clarity. In addition, like reference numerals refer to like elements throughout. The exemplary embodiments described below may be modified in various forms and therefore, the scope of the present invention is not limited to these exemplary embodiments.

FIG. 1 is a block diagram showing a flat panel display device according to an exemplary embodiment of the present invention.

Referring to FIG. 1, the flat panel display device includes a display unit 100, a timing control circuit 200, a scan driving circuit 300, and a data driving circuit 400. The display unit 100 includes a plurality of pixels 10 for displaying images. The pixels 10 are arranged between a plurality of scan lines S1 to Sn and a plurality of data lines D1 to Dm in the form of a matrix, by way of example. The scan lines S1 to Sn extend in a row direction, while the data line D1 to Dm extend in a column direction, each of which crosses the scan lines S1 to Sn. Each of the pixels 10 may include a plurality of sub-pixels, for example, a green sub-pixel G and a blue sub-pixel B. Each of the pixels 10 may also include, for example: an organic light emitting diode including an anode electrode, an organic light emitting layer, and a cathode electrode; or a liquid crystal element including a pixel electrode, a liquid crystal layer, and a common electrode.

The timing control circuit 200 receives an image signal and a control signal from the outside, and outputs a first control signal CS1, a second control signal CS2, and data D. The first and second control signals CS1 and CS2 include a start signal, a clock signal, or the like. The scan driving circuit 300, which is coupled to the scan lines S1 to Sn extending from the display unit 100, receives the first control signal CS1 from the timing control circuit 200, generates a scan signal, and sends the scan signal to the scan lines S1 to Sn. The data driving circuit 400, which is coupled to the data lines D1 to Dm extending from the display unit 100, receives the second control signal CS2 and the data D from the timing control circuit 200, generates a data signal, and sends the data signal to the data lines D1 to Dm.

Figure 2:
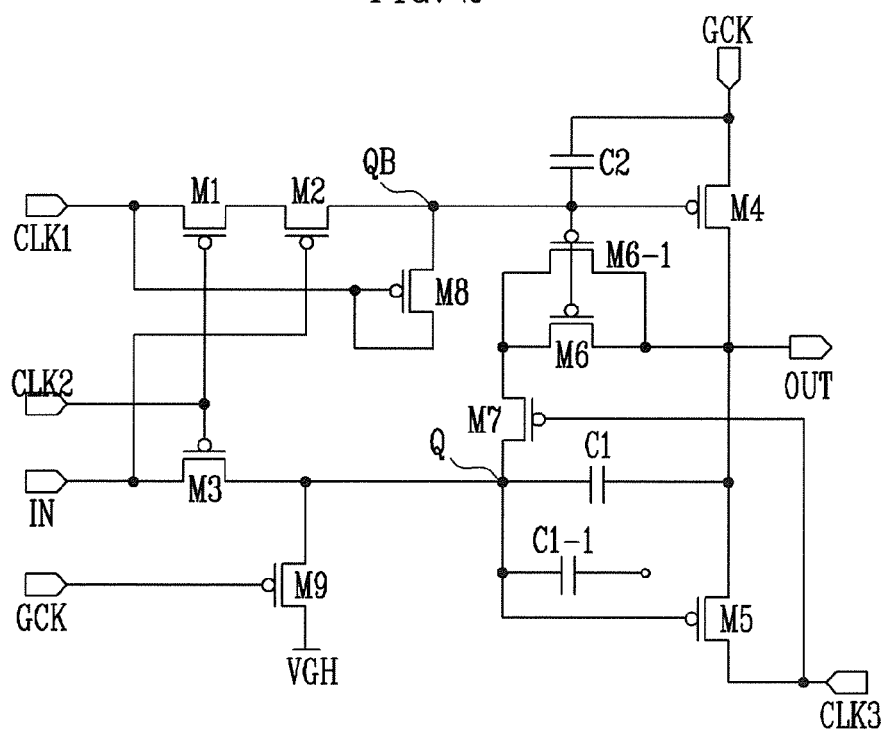
FIG. 2 is a circuit diagram showing an example driving circuit of the flat panel display device of FIG. 1.
Figure 3:
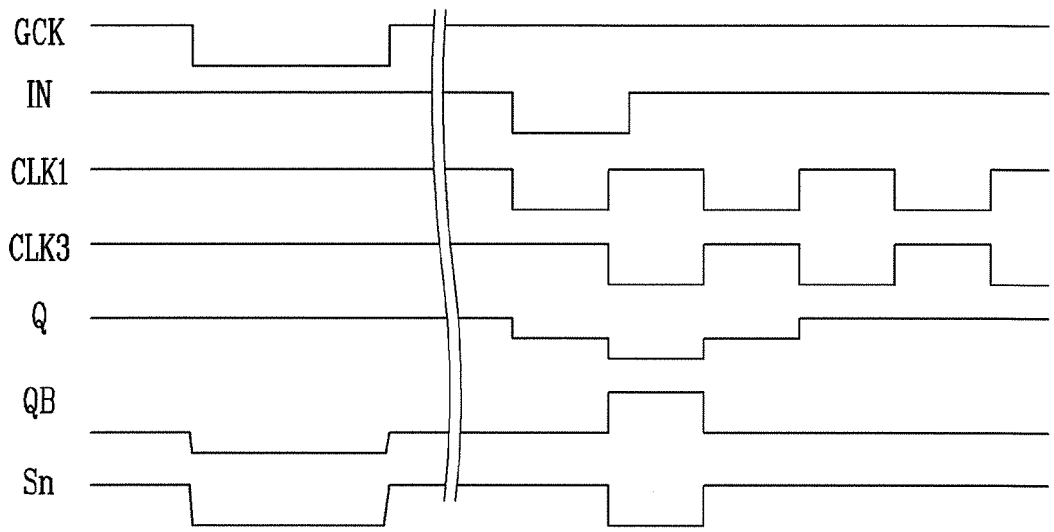
FIG. 3 is a timing chart showing an example operation of the driving circuit of FIG. 2.

FIG. 2 is a circuit diagram showing an example driving circuit of the flat panel display device of FIG. 1, in this case an exemplary embodiment of a driving circuit of the scan driving circuit 300. For example, the scan driving circuit 300 may include n such driving circuits of FIG. 2, one for each of the scan lines S1 to Sn. FIG. 3 is a timing chart showing an example operation of the driving circuit of FIG. 2.

Referring to FIG. 2 and FIG. 3, the driving circuit of the scan driving circuit 300 includes a plurality of input terminals for receiving a plurality of clock signals CLK1, CLK2, and CLK3, a common clock signal GCK, and a previous scan signal Sn-1, or the like, as the first control signal CS1, and an output terminal for outputting the scan signal Sn. The previous scan signal Sn-1 in a low state is input through an input terminal IN. When the clock signals CLK1 and CLK2 are input in a low state, transistors M1, M2, and M3 are turned on, such that potentials at nodes QB and Q become a low state. A transistor M4 is turned on due to the potential at the node QB, such that the potential at an output terminal OUT maintains a high state, which is the potential of the common clock signal GCK. In addition, a transistor M5 is turned on and the clock signal CLK3 is input in a high state due to the potential at the node Q, thereby allowing a first capacitor C1 to be charged.

After a set time period (for example, a predetermined time period) has elapsed, the clock signal CLK1 changes to a high state such that the potential at the node QB changes to a high state and the transistor M4 is turned off. While the transistor M5 is turned on due to the potential at the node Q, when the clock signal CLK3 then changes to a low state, the potential at the output terminal OUT changes to a low state. After another set time period (for example, another predetermined time period) has elapsed, when the clock signal CLK3 changes to a high state, the potential at the output terminal OUT becomes the high state again. Further, when the clock signal CLK1 changes to the low state and the potential at the node QB changes to the low state, a first transistor M6 is turned on. In addition, when the previous scan signal Sn-1 in the high state is input through the input terminal IN and the clock signal CLK2 is input in the low state, the potential at the node Q changes to the high state.

Here, when a transistor M7 is turned on by the clock signal CLK3 in the low state such that voltage between a gate and a source of the transistor M5 becomes 0V, the transistor M5 turns off such that the output terminal OUT maintains the high state even when the clock signal CLK3 is in the low state. In further detail, a transistor M8 is diode-coupled between an input terminal of the clock signal CLK1 and the node QB in order to keep the potential at the node QB constant according to the clock signal CLK1, a transistor M9 keeps the potential at the node Q constant according to the common clock signal GCK (for example, in the high state), and a capacitor C2 keeps the potential between an input terminal of the common clock signal GCK and the gate electrode of the transistor M4 constant.

The scan driving circuit 300 may sequentially output each of the scan signals S1 to Sn through the output terminal OUT of a respective one of n driving circuits (each configured as in FIG. 2) according to clock signals CLK1, CLK2, CLK3, GCK, etc., all of which are part of the first control signal CS1 received from the timing control circuit 200. However, since the output terminal OUT of each driving circuit of the scan driving circuit 300 is coupled to one of the scan lines S1 to Sn of the display unit 100 formed in a relatively large area in a central portion of the display device, static electricity may be easily introduced in the manufacturing or test process. As the size of the display device increases, introduced static electricity increases significantly.

Since static electricity introduced to the output terminal OUT through an edge of the display unit 100 or the scan lines S1 to Sn is first introduced to elements that are coupled to the output terminal OUT or positioned adjacent to the output terminal OUT, for example the transistors M6, M7, and the like, and the capacitors C1, C2, and the like, defects such as damage to the transistors M6, M7, and the like, and/or to the capacitors C1, C2, and the like, are generated. When a defect is generated even in a single element, since it may be difficult for the display device to normally operate, the corresponding display device may not be usable.

To address this, each driving circuit of the scan driving circuit 300 further includes an extra transistor (for example, a second transistor M6-1) and an extra capacitor (for example, a second capacitor C1-1) allowing the driving circuit to normally operate through repair even though defects are generated in the transistors M6, M7, and the like, and/or in the capacitors C1, C2, and the like. For example, the driving circuit of the scan driving circuit 300 includes the first transistor M6 having a source electrode and a drain electrode coupled to the input terminal IN and the output terminal OUT, respectively, and being operated according to signals applied to a gate electrode, and the second transistor M6-1 having a source electrode, a drain electrode, and a gate electrode coupled to the source electrode, the drain electrode, and the gate electrode of the first transistor M6, respectively. Since the first and second transistors M6 and M6-1 have gate electrodes to which the same signal, for example the signal having the potential at the node QB is input, and source electrodes coupled to each other and drain electrodes coupled to each other, they are concurrently (for example, simultaneously) operated.

In addition, the driving circuit of the scan driving circuit 300 includes the first capacitor C1 having first and second electrodes coupled to the input terminal IN and the output terminal OUT, respectively, and the second capacitor C1-1 having a first electrode coupled to the first electrode of the first capacitor C1 and a second electrode that is floated. The second capacitor C1-1 does not work since the second electrode thereof is floated.

Figure 4:
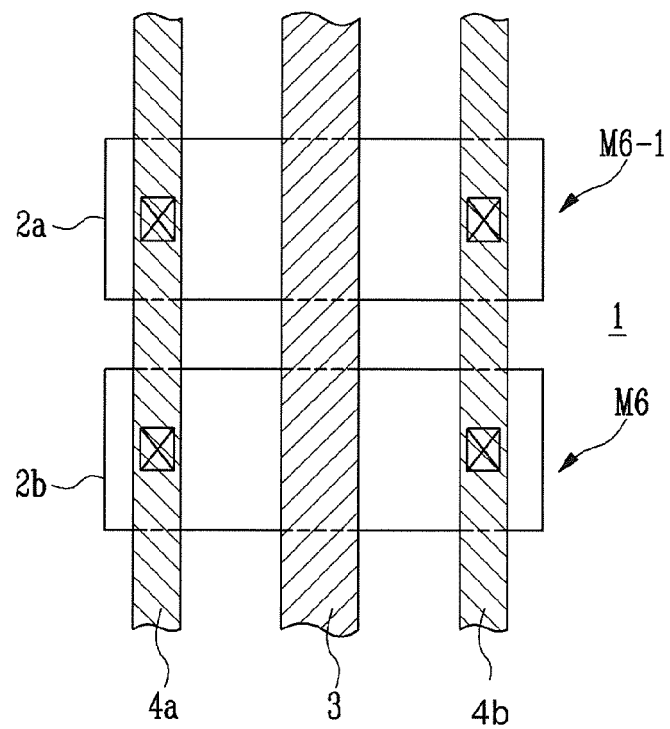
FIG. 4 is a plan view showing an example connection configuration of a first transistor and a second transistor of the driving circuit of FIG. 2.

FIG. 4 is a plan view showing an example connection configuration of the first transistor M6 and the second transistor M6-1 of the driving circuit of FIG. 2.

On a substrate 1, active layers 2a and 2b of the first and second transistors M6 and M6-1 are formed, respectively. The active layers 2a and 2b may be made, for example, of poly silicon or an oxide semiconductor. A gate electrode 3 is formed on a channel region of the active layers 2a and 2b and insulated from the active layers by a gate insulating layer. The gate electrodes 3 of the first and second transistors M6 and M6-1 are commonly coupled to each other. A source electrode 4a and a drain electrode 4b are formed on a source region and a drain region of the active layers 2a and 2b and coupled to the source region and the drain region of the active layers 2a and 2b through contact holes formed in the gate insulating layer. The source electrode 4a of the first and second transistors M6 and M6-1 are commonly coupled to each other. In addition, the drain electrode 4b of the first and second transistors M6 and M6-1 are commonly coupled to each other.

When a defect is generated in the first transistor M6 or the second transistor M6-1 due to static electricity introduced through the output terminal OUT, at least one electrode of the corresponding transistor M6 or transistor M6-1 is electrically separated so that the defective transistor forms an open loop through the repair process. For example, when a defect is generated in the first transistor M6, the gate electrode 3, the source electrode 4a, the drain electrode 4b, or the active layer 2b of the first transistor M6 may be electrically disconnected using laser, or the like, thereby allowing the first transistor M6 to not affect operation of the driving circuit.

Figure 5:
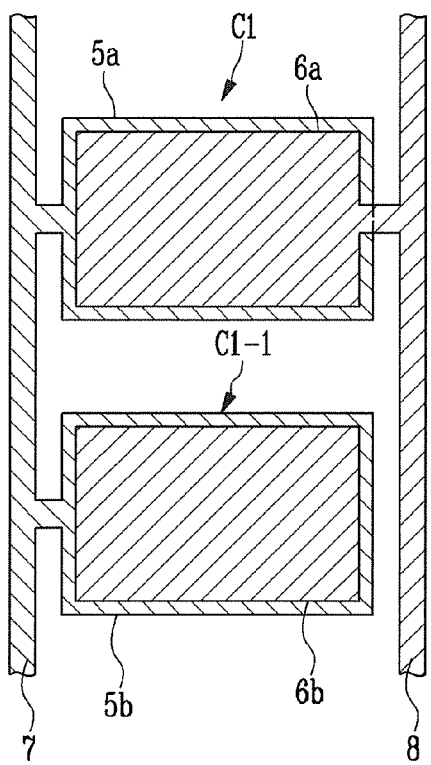
FIG. 5 is a plan view showing an example connection configuration of a first capacitor and a second capacitor of the driving circuit of FIG. 2.
Figure 6:
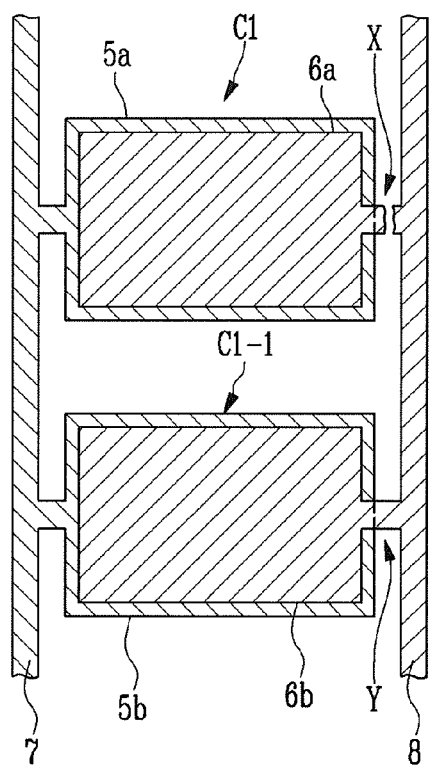
FIG. 6 is a plan view showing an example repair process of the first capacitor and the second capacitor of FIG. 5 according to an exemplary embodiment of the present invention.

FIGS. 5 and 6 are plan views showing an example connection configuration and repair process of the first capacitor C1 and the second capacitor C1-1 of the driving circuit of FIG. 2.

Referring to FIG. 5, each of first electrodes 5a and 5b of the first and second capacitors C1 and C1-1 is formed on the substrate 1 and is coupled to a wire 7 coupled to the node Q, by way of example. The first electrodes 5a and 5b are, for example, lower electrodes, which may be made of doped poly-silicon or metal. An insulating layer is formed as a dielectric layer on the upper surface of the substrate including the first electrodes 5a and 5b and the wire 7, and a second electrode 6a overlapped with the first electrode 5a and a second electrode 6b overlapped with the first electrode 5b are each formed as an upper electrode on the insulating layer. For example, the second electrode 6a of the first capacitor C1 is coupled to a wire 8 coupled to the output terminal OUT, and the second electrode 6b of the second capacitor C1-1 is electrically floated.

The first electrode 5b of the second capacitor C1-1 may be also floated. However, when the second capacitor C1-1 is present in the form of an island that is electrically isolated, electric charges may be concentrated in the second capacitor C1-1. Therefore, it is preferable to couple the first electrode 5b to the wire 7 or the second electrode 6b to the wire 8.

Referring to FIG. 6, when the first electrode 5a and the second electrode 6a of the first capacitor C1 are short-circuited due to static electricity introduced through the output terminal OUT and, as a result, a defect is generated, a connection X between the second electrode 6a and the wire 8 is disconnected using laser, or the like, and the second electrode 6b of the second capacitor C1-1 is coupled to the wire 8 through a connection Y. That is, the second electrode 6a of the first capacitor C1 is electrically separated from the output terminal OUT, and the second electrode 6b of the second capacitor C1-1 is electrically connected to the output terminal OUT.

In order to disconnect the connection X or form the connection Y, the second electrodes 6a and 6b and the wire 8 that are positioned over the first electrodes 5a and 5b and the wire 7 may be made of metal. The connection Y may be easily formed by using metal that is melted by laser. In order to easily form the connection Y, a protrusion part may be formed at a side of the second electrode 6b of the second capacitor C1-1 or a side of the wire 8 adjacent to the second electrode 6b of the second capacitor C1-1.

Through the repair process described above, the circuit functions of the first capacitor C1 and the second capacitor C1-1 are changed from one to the other. That is, the second capacitor C1-1 serves as the first capacitor C1 and has the same connection configuration as that of the first capacitor C1 before the repair process. In addition, the first capacitor C1 has the same connection configuration as that of the second capacitor C1-1 before the repair process. That is, the first and second electrodes 5b and 6b of the second capacitor C1-1 are coupled to the input terminal IN and the output terminal OUT through the wires 7 and 8, respectively, the first capacitor C1 is disposed in parallel with the second capacitor C1-1, the first electrode 5a of the first capacitor C1 is coupled the first electrode 5b of the second capacitor C1-1 through the wire 7, and the second electrode 6a of the first capacitor C1 has a floated structure.

In FIG. 6, the connection X that is disconnected by laser, that is, the floated ending portion of the second electrode 6a, has an irregular cross section. When the second electrode 6a is disconnected by laser, disconnected marks are left on the cross section of the floated ending portion. When the second electrode 6a is made of metal, the cross section thereof is not smooth but irregular due to melting of the metal.

Although in the above mentioned embodiment, the first electrodes 5a and 5b are coupled to the wire 7, the second electrode 6a is coupled to the wire 8, and the second electrode 6b is floated, embodiments of the present invention are not limited thereto and may have any structure in which, when a defect is generated in the first capacitor C1, the first capacitor C1 may be electrically disconnected and the second capacitor C1-1 may be circuit-connected to the wires 7 and 8.

In addition, although FIG. 2 shows the structure in which the second transistor M6-1 and the second capacitor C1-1 for repair are further coupled only to the first transistor M6 and the first capacitor C1 directly connected to the output terminal OUT, respectively, for convenience of description, the present invention is not limited thereto. Embodiments of the present invention may include any structure in which transistors and/or capacitors for repair are further coupled to respective transistors and/or capacitors coupled to positions vulnerable to static electricity.

Although, according to some of the exemplary embodiments, a driving circuit of the scan driving circuit 300 has been described as an example driving circuit, since the output terminal of a driving circuit of the data driving circuit 400 is coupled to one of the data lines D1 to Dm, embodiments of the present invention may be equally applied to driving circuits of the data driving circuit 400. In addition, the structure and operation of a driving circuit of the scan driving circuit 300 is for explaining an exemplary embodiment of the present invention, and thus driving circuits according to embodiments of the present invention are not limited to the structure and operation described above and may be changed to be appropriate for operation of a desired display device as would be apparent to one of ordinary skill in the art.

As set forth above, the output terminal of a driving circuit in a display device is vulnerable to static electricity. The driving circuit has a structure in which the transistors and/or capacitors for repair are coupled in parallel with respective transistors and/or capacitors coupled to the output terminal. When two transistors and/or capacitors coupled in parallel with each other are subjected to static electricity, although the transistor and/or the capacitor adjacent to the output terminal is primarily damaged, other transistors and capacitors may be effectively protected due to buffering effect. When damage is generated due to static electricity, the driving circuit may be easily repaired by electrically separating the damaged transistor and/or the capacitor.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A driving circuit comprising:
   an input terminal;
   an output terminal;
   a first transistor comprising:
      a source electrode coupled to the input terminal;
      a drain electrode electrically coupled to and configured to maintain a same voltage as the output terminal; and
      a gate electrode;
   a first capacitor comprising:
      a first electrode coupled to the input terminal; and
      a second electrode electrically coupled to and configured to maintain the same voltage as the output terminal; and
   a second capacitor coupled in parallel with the first capacitor and comprising:
      a first electrode electrically coupled to and configured to maintain a same voltage as the first electrode of the first capacitor; and
      a second electrode that is floated.

2. The driving circuit according to claim 1, wherein the second electrodes of the first and second capacitors comprise metal.

3. The driving circuit according to claim 2, wherein the second electrode of the second capacitor is configured to be electrically coupled to and maintain the same voltage as the output terminal by melting the metal.

4. The driving circuit according to claim 1, wherein the second electrode of the second capacitor is configured to be electrically coupled to and maintain the same voltage as the output terminal when the first electrode and the second electrode of the first capacitor are short-circuited to each other.

5. The driving circuit according to claim 1, wherein:
   the second electrode of the first capacitor is configured to be floated when the first electrode and the second electrode of the first capacitor are short-circuited to each other, and
   a floated ending portion of the second electrode of the first capacitor has an irregular cross section.

6. The driving circuit according to claim 1, further comprising a second transistor comprising a source electrode, a drain electrode, and a gate electrode respectively coupled to the source electrode, the drain electrode, and the gate electrode of the first transistor.

7. The driving circuit according to claim 6, wherein an electrode of the second transistor is configured to be electrically separated so that the second transistor does not affect operation of the driving circuit.

8. A flat panel display device comprising:
   a plurality of pixels coupled to a plurality of scan lines and a plurality of data lines arranged in a matrix;

a scan driving circuit comprising a driving circuit comprising an input terminal and an output terminal, the driving circuit being configured to:
   receive a first control signal through the input terminal; and
   provide a scan signal to one of the scan lines through the output terminal; and a data driving circuit comprising a driving circuit comprising an input terminal and an output terminal, the driving circuit of the data driving circuit being configured to:
   receive a second control signal and data through the input terminal; and
   provide a data signal to one of the data lines through the output terminal, wherein the driving circuit of the scan driving circuit or the data driving circuit further comprises:
   a first transistor comprising:
      a source electrode coupled to the input terminal;
      a drain electrode coupled to the output terminal; and
      a gate electrode;
   a first capacitor comprising:
      a first electrode coupled to the input terminal; and
      a second electrode electrically coupled to and configured to maintain a same voltage as the output terminal; and
   a second capacitor coupled in parallel with the first capacitor and comprising:
      a first electrode electrically coupled to and configured to maintain a same voltage as the first electrode of the first capacitor; and
      a second electrode that is floated.

9. The flat panel display device according to claim 8, wherein the second electrodes of the first and second capacitors comprise metal.

10. The flat panel display device according to claim 9, wherein the second electrode of the second capacitor is configured to be electrically coupled to and maintain the same voltage as the output terminal by melting the metal.

11. The flat panel display device according to claim 8, wherein the second electrode of the second capacitor is configured to be electrically coupled to and maintain the same voltage as the output terminal when the first electrode and the second electrode of the first capacitor are short-circuited to each other.

12. The flat panel display device according to claim 8, wherein:
   the second electrode of the first capacitor is configured to be floated when the first electrode and the second electrode of the first capacitor are short-circuited to each other, and
   a floated ending portion of the second electrode of the first capacitor has an irregular cross section.

13. The flat panel display device according to claim 8, wherein the driving circuit further comprises a second transistor comprising a source electrode, a drain electrode, and a gate electrode respectively coupled to the source electrode, the drain electrode, and the gate electrode of the first transistor.

14. The flat panel display device according to claim 13, wherein an electrode of the second transistor is configured to be electrically separated so that the second transistor does not affect operation of the driving circuit.

\* \* \* \* \*